United States Patent
Dey et al.

(10) Patent No.: US 12,548,998 B2
(45) Date of Patent: Feb. 10, 2026

(54) PAD VOLTAGE GENERATION TECHNIQUES

(71) Applicant: Arm Limited, Cambridge (GB)

(72) Inventors: Ranabir Dey, Bangalore (IN);
Gayathri Gandhi, Bangalore (IN);
Akshaykumar V Jabi, Dharwad (IN);
Vipul Patel Pursottam, Bangalore (IN)

(73) Assignee: Arm Limited, Cambridge (GB)

( * ) Notice: Subject to any disclaimer, the term of this patent is extended or adjusted under 35 U.S.C. 154(b) by 170 days.

(21) Appl. No.: 17/833,249

(22) Filed: Jun. 6, 2022

(65) Prior Publication Data
US 2023/0396059 A1    Dec. 7, 2023

(51) Int. Cl.
*H02H 9/00* (2006.01)
*H02H 1/00* (2006.01)

(52) U.S. Cl.
CPC ............ *H02H 9/00* (2013.01); *H02H 1/0007* (2013.01)

(58) Field of Classification Search
CPC ................................ H02H 1/0007; H02H 9/00
See application file for complete search history.

(56) References Cited

U.S. PATENT DOCUMENTS

| | | | | |
|---|---|---|---|---|
| 5,512,844 | A  * | 4/1996 | Nakakura | H03K 19/00315 326/27 |
| 6,323,704 | B1* | 11/2001 | Pelley | H03K 19/00315 327/333 |
| 7,786,760 | B2* | 8/2010 | Wang | H03K 19/018521 326/68 |
| 9,614,529 | B1* | 4/2017 | Chen | H03K 19/018507 |
| 11,531,363 | B2* | 12/2022 | Bogi | H03K 19/007 |
| 2010/0141324 | A1* | 6/2010 | Wang | H03K 19/018521 327/333 |
| 2016/0372918 | A1* | 12/2016 | Chen | H02H 9/046 |
| 2022/0352712 | A1* | 11/2022 | Lee | H02H 9/046 |

* cited by examiner

*Primary Examiner* — Menatoallah Youssef
*Assistant Examiner* — Khareem E Almo
(74) *Attorney, Agent, or Firm* — Pramudji Law Group PLLC; Ari Pramudji (57) ABSTRACT

Various implementations described herein are related to a device with a bias generator that receives a pad control signal, receives an output pad voltage as a pad feedback signal from an output pad, and provides bias voltage signals based on the pad control signal and the pad feedback signal. The device may have a bias driver that receives the bias signals from the bias generator and provides the output pad voltage to the output pad based on the bias signals. The device may have a pad voltage detector that receives the output pad voltage as the pad feedback signal from the output pad and provides the pad control signal to the bias generator based on the pad feedback signal.

20 Claims, 6 Drawing Sheets

PAD VOLTAGE GENERATION TECHNIQUES

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Due to technological scaling down in some conventional designs, the maximum operating voltage that a device can withstand is also scaling down. As such, some input-output (IO) devices cannot withstand higher operating voltages and are thus deficient and relatively inadequate for modern use in situations where legacy standards still use higher supply voltages. Hence, there exists a need to improve conventional circuit designs that can withstand higher operating voltages.

In some microcontroller applications, the output pad may have sinking currents requirement due to the usage in some specific applications (e.g., sensor in automotive industry). Sinking currents at the PAD can be realized through electrostatic discharge (ESD) diodes that are used for discharging any ESD event. During tolerant conditions, sinking currents may cause negative output pad voltage operation, which cause reliability issues for output driver circuitry. Thus, there exists a need to reduce over-voltage stress so as to increase operational longevity of conventional circuit designs.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are related to pad voltage generation schemes and techniques for various voltage biasing applications in physical design. Also, the pad voltage generation schemes and techniques may refer to voltage control schemes and techniques across terminals of various devices. For instance, various schemes and techniques described herein may provide for a bias generator that provides bias voltage signals based on a pad control voltage and an output pad voltage that is received as a pad feedback voltage from an output pad. Also, a bias driver may be used to provide the output pad voltage to the output pad based on the bias voltage signals. Also, a pad control generator may be used to detect a negative voltage caused by negative current injection at the output pad based on the output pad voltage and provides the pad control voltage to the bias generator in response to detecting the negative voltage.

In some implementations, the pad voltage generation schemes and techniques described herein may provide for an intermediate voltage generator that is configured to derive an intermediate voltage from the pad control voltage and the pad feedback voltage provided by the output pad. The bias generator may receive the pad control voltage from the pad control generator, receive the intermediate voltage from the intermediate voltage generator, receive the output pad voltage as the pad feedback voltage from the output pad, and provide the bias voltage signals to the bias driver based on the pad control voltage, the intermediate voltage and/or the pad feedback voltage.

In some implementations, the bias generator may include an nbias generator that generates an nbias voltage signal of the bias voltage signals based on the pad control voltage and the intermediate voltage, and then provides the nbias voltage signal to the bias driver. Also, the bias generator may have a pbias generator that generates a pbias voltage signal of the bias voltage signals based on the intermediate voltage and the pad feedback voltage, and then provides the pbias voltage signal to the bias driver. The bias driver may have a p-type driver stack having p-type transistors that are activated with the pbias voltage signal from the pbias generator. Also, the bias driver may have an n-type driver stack having n-type transistors that are activated with the nbias voltage signal from the nbias generator. Also, the bias driver may provide the output pad voltage to the output pad from an output node disposed between the p-type driver stack and the n-type driver stack and based on the pbias voltage signal and the nbias voltage signal.

Various implementations of pad voltage generation schemes and techniques will be described in greater detail herein with reference to FIGS. 1-5.

Figure 1:
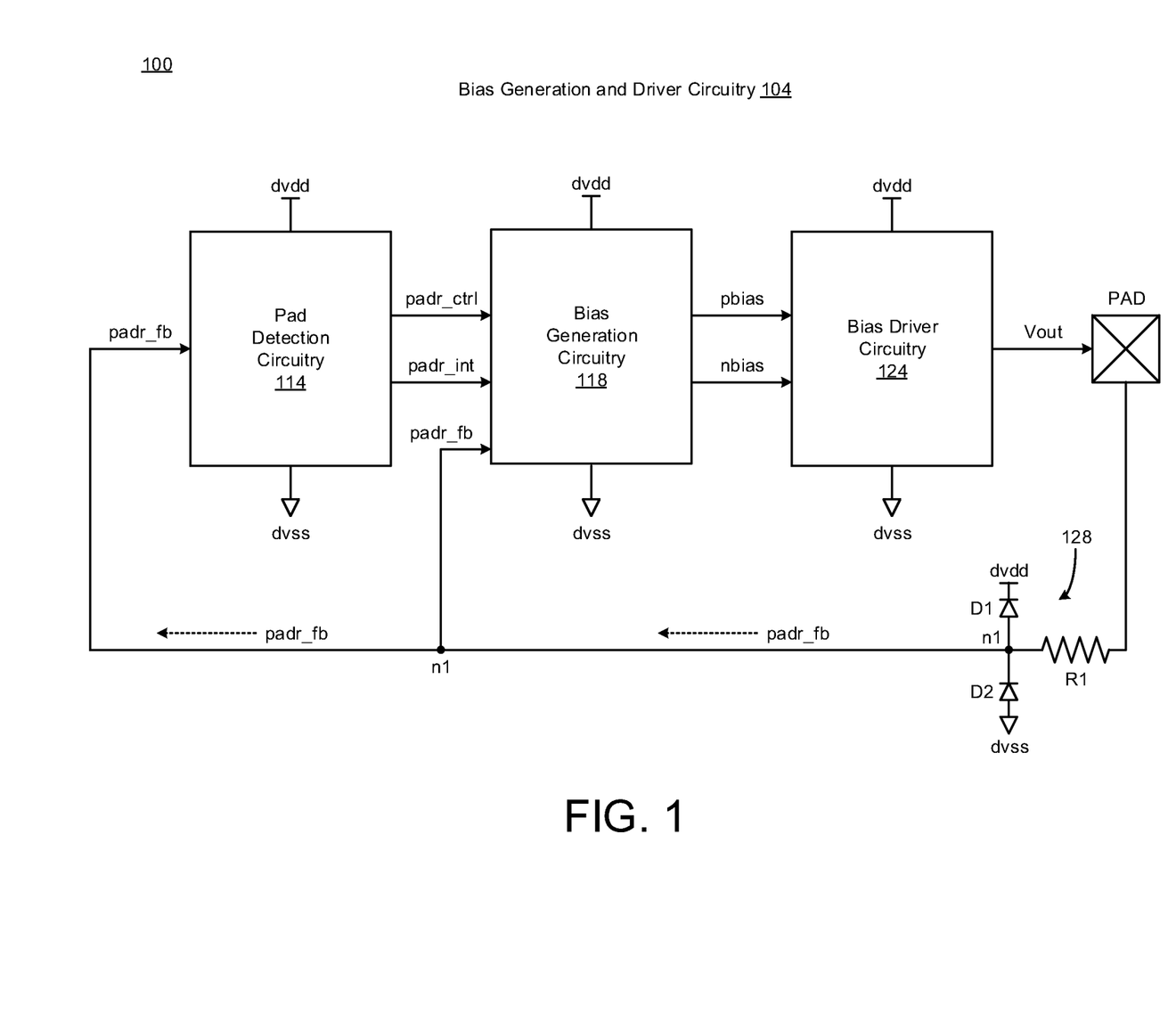
FIG. 1 illustrates a schematic diagram of bias generation and driver circuitry in accordance with various implementations described herein.

FIG. 1 illustrates a diagram 100 of bias generation and driver circuitry 104 in accordance with various implementations described herein. In some scenarios, the bias generation and driver circuitry 104 may have pad voltage generation circuitry that involves use of various pad voltage generation schemes and techniques described herein.

In various implementations, the bias generation and driver circuitry 104 may be implemented as a system or device having various integrated circuit (IC) components that are arranged and coupled together as an assemblage or combination of parts that provide for physical circuit layout design and related structures. In some instances, a method of designing, fabricating, building and providing the bias generation and driver circuitry 104 as an integrated system or device involves use of various IC circuit components described herein so as to implement various pad generation schemes and techniques associated therewith. The bias generation and driver circuitry 104 may be integrated with computing circuitry and related components on a single chip, and also, the bias generation and driver circuitry 104 may be implemented within embedded systems for automotive, electronic, mobile, server and Internet-of-things (IoT) applications.

As shown in FIG. 1, the bias generation and driver circuitry 104 may include various circuitry including, e.g., pad detection circuitry 114, bias generation circuitry 118 and bias driver circuitry 124. The pad detection circuitry 114 may be referred to as negative current injection detection circuitry. In some instances, the various circuitry 114, 118, 124 may be coupled together to receive a supply voltage (dvdd) and provide an output pad voltage (Vout) to an output pad (PAD). In some instances, the various circuitry 114, 118, 124 may also receive the output pad voltage (Vout) as a pad feedback voltage and/or a pad feedback signal (padr_fb) from the output pad (PAD). In general, the output pad voltage (Vout) is similar to (or the same as) the PAD voltage (Vpad), and the pad feedback signal (padr_fb) is similar to (or the same as) the PAD voltage (Vpad). Thus, Vout is provided to the PAD, and padr_fb is supplied from the PAD, wherein Vout=Vpad=padr_fb. Also, in some implementations, the padr_fb node is not the same as the PAD, and their voltage values are the same (i.e., the PAD voltage is the same as or similar to the padr_fb voltage), but they are different branches. For instance, the padr_fb is taken after the secondary resistor connection at node (n1), which is supplied by the PAD node.

Also, in some instances, the various circuitry 114, 118, 124 may operate in one or multiple voltage domains, such as, e.g., a core supply voltage domain (vdd) and/or an input-output (I/O) supply voltage domain (dvdd). Therefore, in various scenarios, the pad detection circuitry 114, the bias generation circuitry 118 and the bias driver circuitry 124 are coupled between supply voltage (dvdd) and ground (dvss).

The bias generation circuitry 118 may refer to a bias generator that is configured to receive pad control signal (padr_ctrl), receive output pad voltage (Vout) as a pad feedback signal (padr_fb) from the output pad (PAD), and provide bias voltage signals (pbias, nbias) based on the pad control signal (padr_ctrl) and the pad feedback signal (padr_fb). Also, the bias driver circuitry may refer to a bias driver that is configured to receive the bias signals (pbias, nbias) from the bias generation circuitry 118 and provide the output pad voltage (Vout) to the output pad (PAD) based on the bias signals (pbias, nbias). Moreover, the pad detection circuitry 114 may refer to a pad voltage detector that receives the output pad voltage (Vout) as the pad feedback signal (padr_fb) from the output pad (PAD) and provide the pad control signal (padr_ctrl) to the bias generation circuitry 118 based on one or more signals including the pad feedback signal (padr_fb).

In some implementations, the pad voltage generation circuitry 114 may receive the output pad voltage (Vout) as the pad feedback signal (padr_fb) from the output pad (PAD) and then generate the pad control signal (padr_ctrl) based on the pad feedback signal (padr_fb). The pad voltage generation circuitry 114 may generate an intermediate signal (padr_int) based on pad feedback signal (padr_fb) and pad control signal (padr_ctrl) and then provide pad control signal (padr_fb) and intermediate signal (padr_int) to the bias generation circuitry 118. The bias generation circuitry 118 may receive pad control signal (padr_ctrl) from the pad voltage generation circuitry 118, receive the intermediate signal (padr_int) from the pad voltage generation circuitry 118, and also receive the output pad voltage (Vout) as the pad feedback voltage (padr_fb) from the output pad (PAD). The bias generation circuitry 118 may then provide bias voltage signals (pbias, nbias) to the bias driver circuitry 124 based on one or more of the pad control signal (padr_ctrl), intermediate signal (padr_int) and pad feedback signal (padr_fb).

In some implementations, the bias generation and driver circuitry 104 may have diode circuitry 128 that is coupled between the output pad (PAD) and the pad detection circuitry 114. The diode circuitry 128 may include various circuit components, including, e.g., one or more diodes (D1, D2) and one or more resistors (R1). In some instances, the diodes (D1, D2) may be coupled between the supply voltage (dvdd) and ground (dvss), wherein a first diode (D1) is coupled between dvdd and node (n1), and wherein a second diode (D2) is coupled between node (n1) and ground (dvss). Also, in some instances, the resistor (R1) may be coupled between the output pad (PAD) and node (n1), wherein node (n1) is coupled to the pad detection circuitry 114.

In various implementations, under normal working conditions, the following voltage behaviors and characteristics may apply:

$p$bias=0V and $n$bias=DVDD (3.63V)

During tolerant conditions, during −2 mA current injection, the following voltage behaviors and characteristics may apply:

$p$bias≤2.63V and $n$bias=−1V (PAD)

During tolerant conditions, during 3 mA current injection, the following voltage behaviors and characteristics may apply:

$p$bias=PAD and $n$bias=DVDD

Some tolerant circuits experience gate voltage over-stress during negative pad current injection (e.g., when PAD=−1.0V). The biasing circuitry provided herein is used to map this negative PAD voltage to a positive value in a range between 0V and 2.63V.

This lifted PAD voltage may be used to generate pbias signals and nbias signals that are used to bias PMOS/NMOS stacked drivers. In some instances, the pbias/nbias signals may be generated in such a way that during PAD operating voltage range of 4.63V to −1.0V, the pbias/nbias voltages may be set on the fly so as to avoid any stress across the PMOS/NMOS transistors.

In various implementations, the physical circuit solution described herein may provide the following sub-blocks:
  control voltage (padr_ctrl) generation to detect negative current injection,
  mapping PAD voltage to intermediate voltage padr_int using padr_ctrl, PAD=4.63V=>padr_int=4.63V, PAD=−1.0V=>padr_int=positive voltage between 0V and 2.63V, generate pbias and nbias signals, and
  use pbias signals and nbias signals in transmitter (Tx) block and receiver (Rx) block so as to avoid reliability issues.

Figure 2:
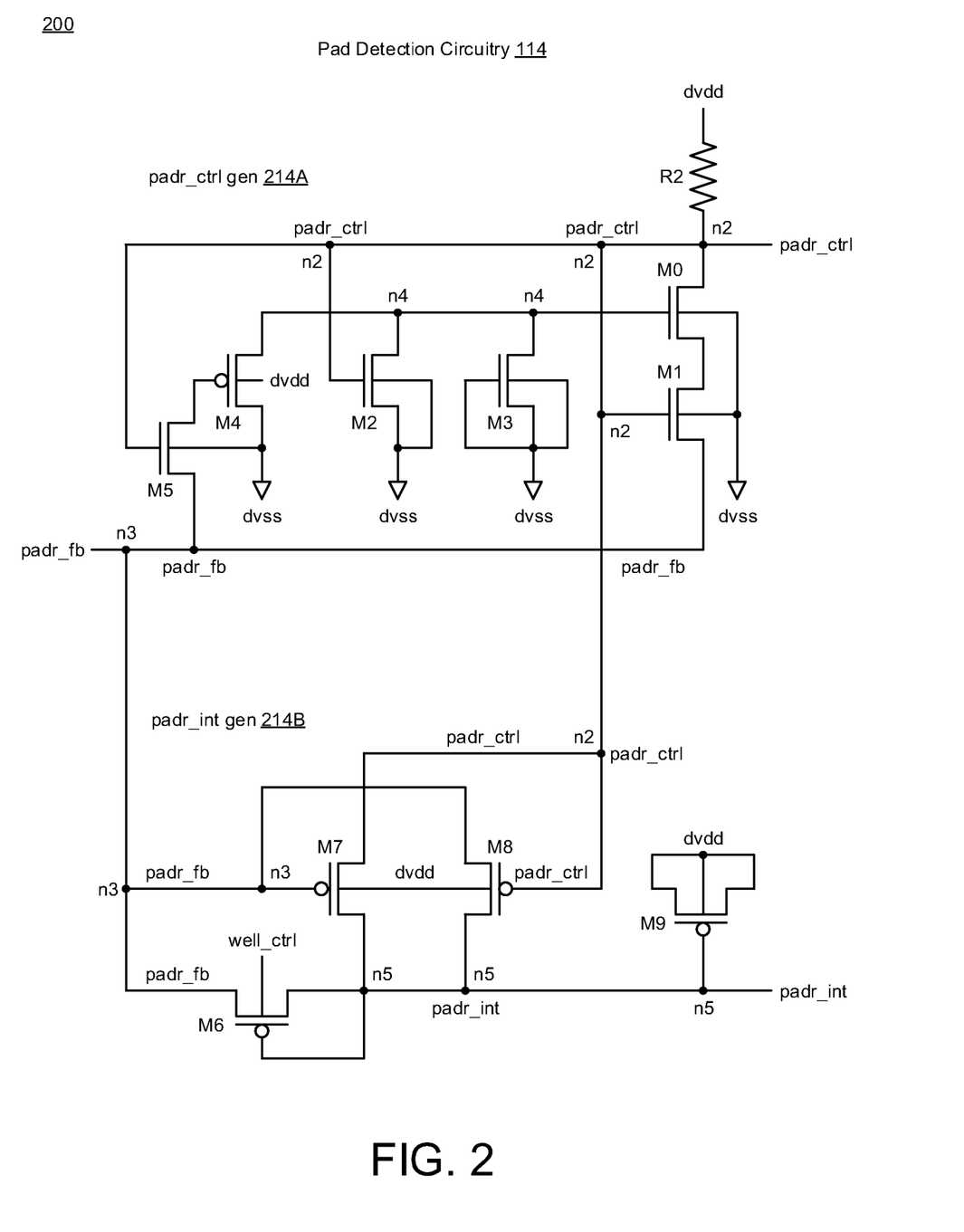
FIG. 2 illustrates a diagram of pad generation circuitry in accordance with various implementations described herein.

FIG. 2 illustrates a diagram 200 of pad detection circuitry 114 in accordance with various implementations described herein. In some instances, the pad detection circuitry 114 may be referred to as negative current injection detection circuitry, and thus, the pad detection circuitry 114 may be configured to operate as negative current injection detection circuitry in a manner as described herein.

In some implementations, the pad voltage generation circuitry 114 may include pad control generation circuitry 214A that is configured to detect a negative voltage at the output pad (PAD) caused by a negative current injection at the output pad (PAD) based on the output pad voltage (Vout) and then generates the pad control signal (padr_ctrl) in response to detecting the negative voltage at the output pad (PAD). Also, the pad voltage generation circuitry 114 may have intermediate generation circuitry 214B that derives the intermediate signal (padr_int) from the pad control signal (padr_ctrl) and/or the output pad voltage (out, padr_fb). The intermediate generation circuitry (padr_int gen) 214B receives the output pad voltage (Vout) as pad feedback signal (padr_fb) from the output pad (PAD), receives pad control signal (padr_ctrl) from the pad control generation circuitry (padr_ctrl gen) 214A, generates the intermediate signal (padr_int) based on the pad feedback signal (padr_fb) and the pad control signal (padr_ctrl), and then provides the intermediate signal (padr_int) to the bias generation circuitry 118. Further, in some instances, the pad control generation circuitry 214A may receive the output pad voltage (Vout) as pad feedback signal (padr_fb) from the output pad (PAD), generate the pad control signal (padr_ctrl) based on the pad feedback signal (padr_fb), and then provide the pad control signal (padr_ctrl) to the bias generation circuitry 118.

In some scenarios, the pad voltage generation circuitry 114 may be configured to generate the pad control signal (padr_ctrl) based on the pad feedback signal (padr_fb), generate the intermediate signal (padr_int) based on the pad feedback signal (padr_fb) and the pad control signal (padr_ctrl), and then provide the pad control signal (padr_ctrl) and the intermediate signal (padr_int) to the bias generation circuitry 118. Also, the bias generation circuitry 118 may be configured to generate the bias voltage signals (pbias, nbias) based on the pad control signal (padr_ctrl), the intermediate signal (padr_int) and the pad feedback signal (padr_fb). Moreover, in some instances, the bias voltage signals (pbias, nbias) may include a pbias voltage signal (pbias) for biasing p-type transistors and an nbias voltage signal (nbias) for biasing n-type transistors.

In various implementations, the pad control generation circuitry (pad_ctrl gen) 214A may include multiple transistors (M0, M1, M2, M3, M4, M5) that are arranged to receive the pad feedback signal (padr_fb) and generate/provide the pad control signal (padr_ctrl) based on the padr_fb signal. The pad_ctrl gen 214A may include a resistor (R2) coupled between dvdd and padr_ctrl signal at output node (n2). Also, transistors (M0, M1) may be coupled in series between the padr_ctrl signal at output node (n2) and the padr_fb at the input node (n3), and the substrate terminals of transistors (M0, M1) may be coupled to ground (dvss). Also, the gate of transistor (M0) may be coupled to drain of transistors (M2, M3, M4), and the gate of transistor (M1) may be coupled to the padr_ctrl signal at output node (n2). Also, transistor (M2) may be coupled between node (n4) and ground (dvss) with its substrate terminal coupled to ground (dvss) and with its gate coupled to the padr_ctrl signal at output node (n2). Also, transistor (M3) may be coupled between node (n4) and ground (dvss) with its substrate terminal and gate coupled to ground (dvss). Also, transistor (M4) may be coupled between node (n4) and ground (dvss) with its substrate terminal coupled to supply voltage (dvdd) and with its gate coupled to transistor (M5). Also, transistor (M5) may be coupled between the gate of transistor (M4) and pad feedback signal (padr_fb) at input node (n3) with its substrate terminal coupled to ground (dvss) and with its gate coupled to the padr_ctrl signal at output node (n2).

In various implementations, the intermediate generation circuitry (padr_int gen) 214B may include multiple transistors (M6, M7, M8, M9) that are arranged to receive pad feedback signal (padr_fb), receive pad control signal (padr_ctrl) and generate/provide the intermediate signal (padr_int) based on the padr_ctrl signal and the padr_fb signal. Also, transistor (M6) may be coupled between the padr_fb signal at input node (n3) and padr_int signal at output node (n5) with its substrate terminal coupled to a well control signal (well_ctrl) and with its gate coupled to padr_int signal at output node (n5). Also, transistor (M7) may be coupled between the padr_ctrl signal at output node (n2) and padr_int signal at output node (n5) with its substrate terminal coupled to ground (dvdd) and with its gate coupled to the padr_fb signal and its source coupled to output node (n5). Also, transistor (M8) may be coupled between padr_fb signal at input node (n3) and the padr_int signal at output node (n5) with its substrate terminal coupled to ground (dvdd) and with its gate coupled to padr_ctrl signal at output node (n2). Also, in some instances, transistor (M9) may be coupled together as a capacitor to supply (dvdd) with its substrate terminal coupled to supply (dvdd) and with its gate coupled to padr_int signal at output node (n5).

In some implementations, transistors (M0, M1, M2, M3, M5) may be n-type metal-oxide-semiconductor (NMOS) transistors, such as, e.g., n-type field effect transistors (NFETs). In other implementations, transistors (M4, M6, M7, M8, M9) may be p-type metal-oxide-semiconductor (PMOS) transistors, such as, e.g., p-type field effect transistors (PFETs).

Figure 3:
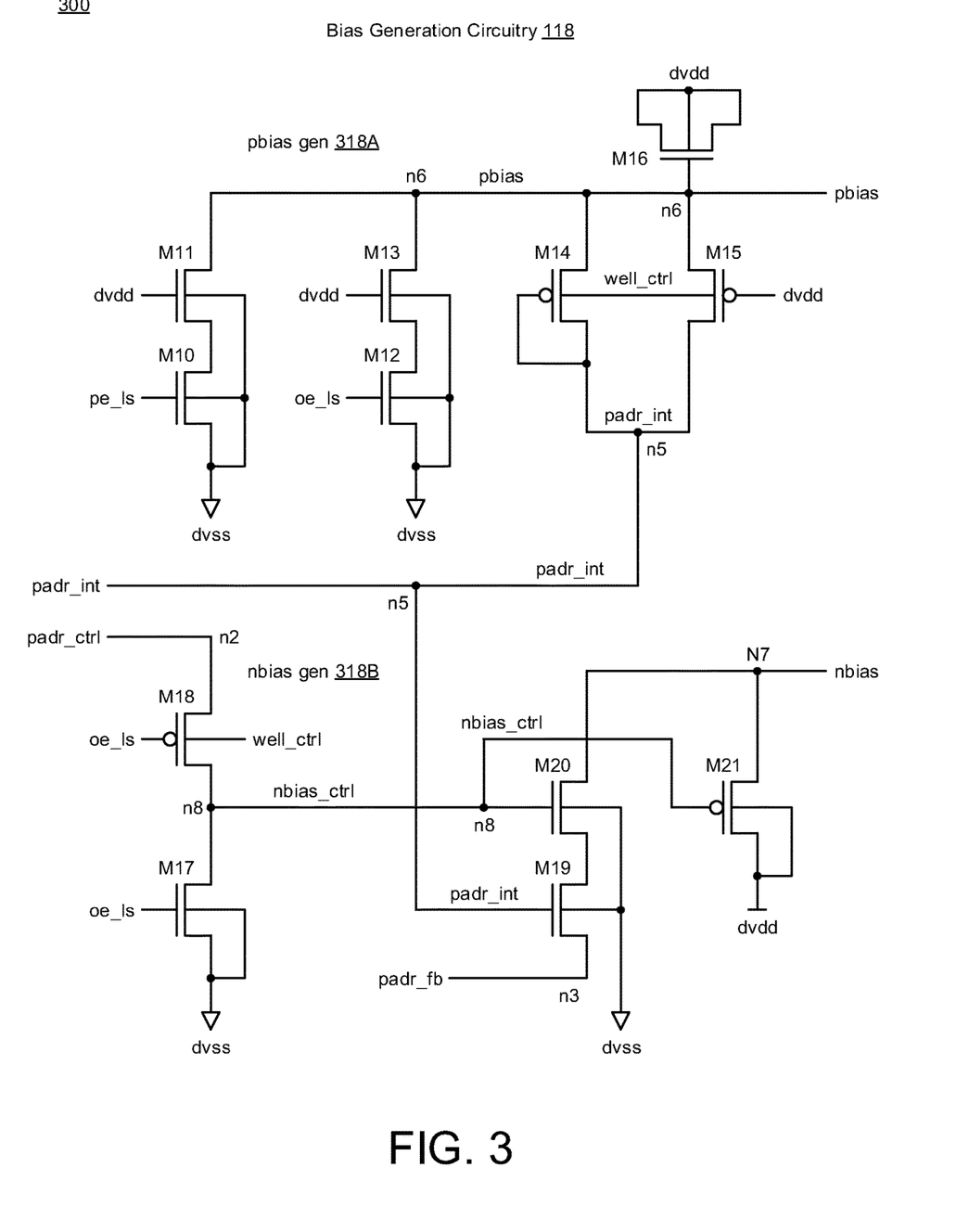
FIG. 3 illustrates a diagram of bias generation circuitry in accordance with various implementations described herein.

FIG. 3 illustrates a diagram 300 of bias generation circuitry 118 in accordance with various implementations described herein.

In some implementations, the bias generation circuitry 118 may include pbias generation circuitry (pbias gen) 318A that receives the intermediate signal (padr_int) from the intermediate generation circuitry (padr_int gen) 214B, receives the output pad voltage (Vout) as the pad feedback signal (padr_fb) from the output pad (PAD), and then generates pbias voltage signal (pbias) of the bias voltage signals based on the intermediate signal (padr_int) and the pad feedback signal (padr_fb). Also, in some instances, the pbias gen 318A provides the pbias voltage signal (pbias) to the bias driver circuitry 124.

In some implementations, the bias generation circuitry 118 may include nbias generation circuitry (nbias gen) 318B that receives pad control signal (padr_ctrl) from the pad control generation circuitry (padr_ctrl gen_214A, receives the intermediate signal (padr_int) from the intermediate generation circuitry (padr_int) 214B, and then generates nbias voltage signal (nbias) of the bias voltage signals based on the pad control signal (padr_ctrl) and the intermediate signal (padr_int). Also, in some instances, the nbias gen 318B provides the nbias voltage signal (nbias) to the bias driver circuitry 124.

In various implementations, the pbias generation circuitry (pbias gen) 318A may include multiple transistors (M10, M11, M12, M13, M14, M15, M16) that are arranged to receive the intermediate signal (padr_int) and generate/provide the pbias signal (pbias) based on the padr_int signal. Transistors (M10, M11) may be coupled in series between pbias signal at output node (n6) and ground (dvss) with their substrate terminals coupled to ground (dvss). The gate of transistor (M10) may be coupled to input signal (pe_ls), and the gate of transistor (M11) may be coupled to supply voltage (dvdd). Also, transistors (M12, M13) may be coupled in series between pbias signal at output node (n6) and ground (dvss) with their substrate terminals coupled to ground (dvss). The gate of transistor (M12) may be coupled to input signal (oe_ls), and the gate of transistor (M13) may be coupled to supply voltage (dvdd). Also, transistor (M14) may be coupled between pbias signal at output node (n6) and padr_int signal at input node (n5) with its substrate terminal coupled to well_ctrl signal and with its gate coupled to the padr_int signal at input node (n5). Also, transistor (M15) may be coupled between pbias signal at output node (n6) and padr_int signal at input node (n5) with its substrate terminal coupled to well_ctrl signal and with its gate coupled to the supply voltage (dvdd). Also, in some instances, transistor (M16) may be coupled together as a capacitor to the supply voltage (dvdd) with its substrate terminal coupled to dvdd and with its gate coupled to the pbias signal at output node (n6).

In various implementations, the nbias generation circuitry (nbias gen) 318B may include multiple transistors (M17, M18, M19, M20, M21) that are arranged to receive the pad control signal (padr_ctrl) and generate/provide the nbias signal (nbias) based on the padr_ctrl signal and the padr_fb signal. Transistors (M17, M18) may be coupled in series between the padr_ctrl signal at input node (n2) and ground (dvss). The substrate terminal of transistor (M17) may be coupled to ground (dvss), and the substrate terminal of transistor (M18) may be coupled to well_ctrl signal. The gate of transistor (M17) may be coupled to the input signal (oe_ls), and the gate of transistor (M18) may be coupled to the input signal (oe_ls). Also, the nbias control signal (nbias_ctrl) may be provided at node (n8), which is disposed between transistors (M17, M18). Also, transistors (M19, M20) may be coupled in series between nbias signal at output node (n7) and padr_fb signal at input node (n3) with their substrate terminals coupled to ground (dvss). The gate of transistor (M19) may be coupled to the padr_int signal at input node (n5), and the gate of transistor (M20) may be coupled to the nbias_ctrl signal at node (n8). In some instances, transistor (M21) may be coupled between nbias signal at output node (n7) and ground (dvss) with its substrate terminal coupled to ground (dvss) and its gate coupled to the nbias_ctrl signal at node (n8).

In some implementations, the well_ctrl signal is used to bias Nwells/substrates of PMOS drivers in 124 and also PMOS transistors used in 114, 118. The well_ctrl voltage may be generated based on padr_int voltage and IO supply voltage DVDD. During normal operation, when the output or the weak pull is enabled, then oe_ls or pe_ls may be set to DVDD. Also, oe_ls or pe_ls may turn ON the NMOS T8-T9 stacks or the NMOS T10-T11 stacks and make padr_ctrl to 0V. If padr_ctrl is 0V, then T4 may be set the well_ctrl node to DVDD. However, during tolerant condition, whenever PAD voltage >DVDD, then padr_int follows PAD and padr_int may be greater than the DVDD voltage. It may turn ON the PMOS T7 and make padr_ctrl to padr_int. Also, PMOS T0 and T1 may turn ON and set the well_ctrl node to padr_int. Thus, in various instances, the well_ctrl node may track higher voltage of DVDD and PAD (i.e., Vpad). Transistors T0, T1, T4, T7, T8, T9, T10, T11 are described in greater detail herein in reference to FIG. 5.

$V(well\_ctrl) = \max\{DVDD, PAD\}$ $oe\_ls \Rightarrow$ output enable signal in DVDD level $pe\_ls \Rightarrow$ weak pull enable in DVDD level In some implementations, transistors (M10, M11, M12, M13, M17, M19, M20) may be n-type metal-oxide-semiconductor (NMOS) transistors, such as, e.g., n-type field effect transistors (NFETs). In other implementations, transistors (M14, M15, M16, M18, M21) may be p-type metal-oxide-semiconductor (PMOS) transistors, such as, e.g., p-type field effect transistors (PFETs).

In some implementations, the padr_ctrl block detects negative current injection at the PAD and generates the control voltage padr_ctrl. By using padr_ctrl, intermediate voltage padr_int is derived, and even though PAD switches from −1V to 4.63V, the padr_int node maps the PAD voltage between 2.63V to 4.63V. Also, as M0 is turned-off, there is no current in the padr_ctrl block during normal operation.

In some implementations, the nbias and pbias signals may be generated to bias NMOS and PMOS driver stacks. These bias signals may be used to ensure that there is no over-voltage stress during normal or tolerant operations.

When the PAD switches from 0V to 3.63V:
pbias=0V and nbias is set to DVDD,
tolerant condition (PAD=4.63V),
pbias is set to padr_int and nbias=(padr_int−Vth),
PMOS driver path is cut-off by setting pbias to PAD voltage=4.63V,
negative injection condition (PAD=−1V),
pbias is set to padr_int, which is a positive voltage, and nbias is set to PAD or −1.0V to cut-off NMOS driver.

Figure 4:
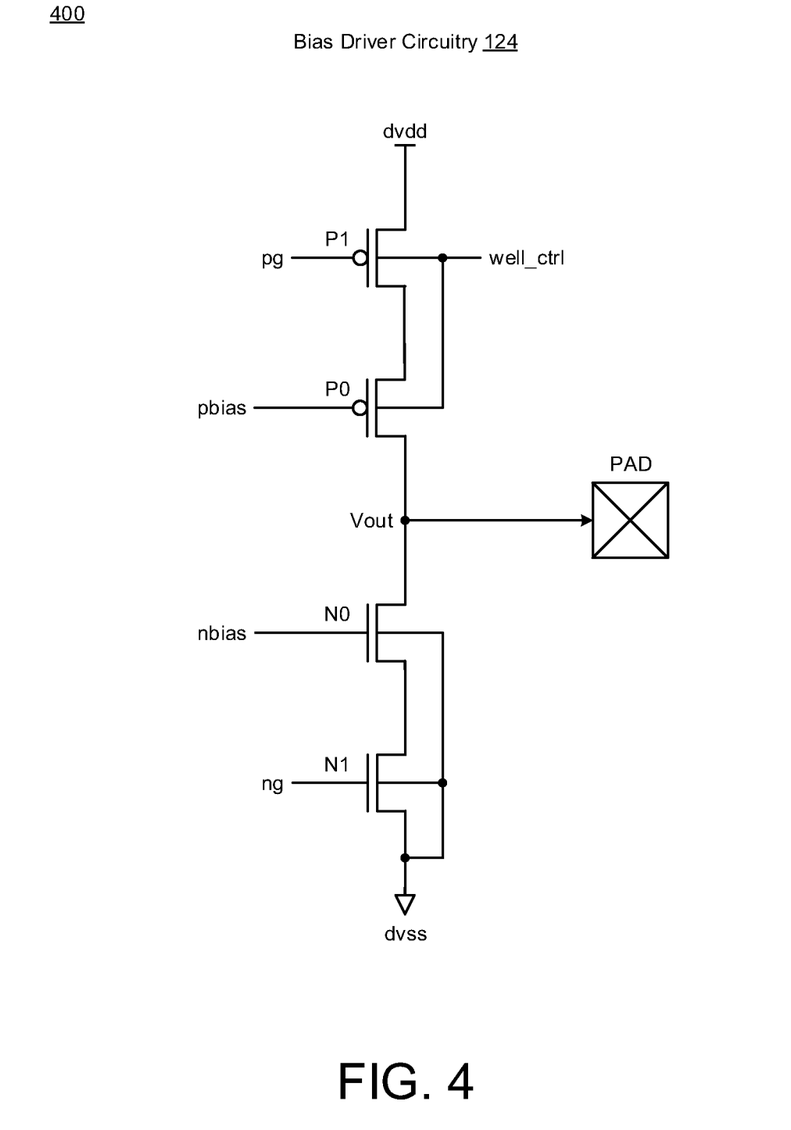
FIG. 4 illustrates a diagram of bias driver circuitry in accordance with various implementations described herein.

FIG. 4 illustrates a diagram 400 of bias driver circuitry 124 in accordance with various implementations described herein.

In some implementations, the bias driver circuitry 124 may have a p-type driver stack (P0, P1) with p-type transistors that may be activated with the pbias voltage signal (pbias) from the pbias generation circuitry (pbias gen) 318A. The p-type driver stack may have any number of p-type transistors. For instance, in some scenarios, the p-type driver stack may include multiple transistors (P0, P1) that are coupled in series between supply voltage (dvdd) and an output node (Vout). In this instance, transistor (P0) may be coupled between transistor (P1) and output node (Vout) with its gate coupled to the pbias signal as provided from pbias gen 318A at node (n6). Also, transistor (P1) may be coupled between supply voltage (dvdd) and transistor (P0) with its gate coupled to the pg signal.

Also, in some implementations, the bias driver circuitry 124 may have an n-type driver stack (N0, N1) with n-type transistors that may be activated with the nbias voltage signal from the nbias generation circuitry (nbias gen) 318B. The n-type driver stack may have any number of n-type transistors. For instance, in some scenarios, the n-type driver stack may include multiple transistors (N0, N1) that are coupled in series between output node (Vout) and ground (dvss). In this instance, transistor (N0) may be coupled between output node (Vout) and transistor (N1) with its gate coupled to the nbias signal as provided from nbias gen 318B at node (n7). Also, transistor (N1) may be coupled between transistor (N0) and ground (dvss) with its gate coupled to the ng signal.

In various implementations, the bias driver circuitry 124 may be configured to provide the output pad voltage (Vout) to the output pad (PAD) from the output node (Vout), which is disposed between p-type driver stack (P0, P1) and n-type driver stack (N0, N1) and based on the pbias voltage signal and the nbias voltage signal. In some instances, the bias driver circuitry 124 may include pre-driver circuitry that is configured to generate and provide complementary signals (pg, ng) as input to the bias driver circuitry 124. Also, output node (Vout) provides the pad output signal (Vout) to the output pad (PAD), and further, the output pad (PAD) may provide the pad feedback signal (padr_fb) to the pad voltage generation circuitry 114 and/or the bias generation circuitry 118 as input thereto.

In some implementations, the pg signal may be used to control the PMOS driver and the ng signal may be used to control the NMOS driver. When logic 0 is expected to transfer to Vout node (PAD node), then pg and ng will set to DVDD. PG setting to DVDD will turn off PMOS driver, and NG setting to DVDD will turn on NMOS driver. Thus, output Vout will discharge to 0V. Likewise, whenever logic 1 is expected to transfer to Vout node (PAD node), then the pg/ng signals will be reset to 0V, which will turn off the NMOS driver, but turn on the PMOS driver, and charge the output PAD to logic 1.

Figure 5:
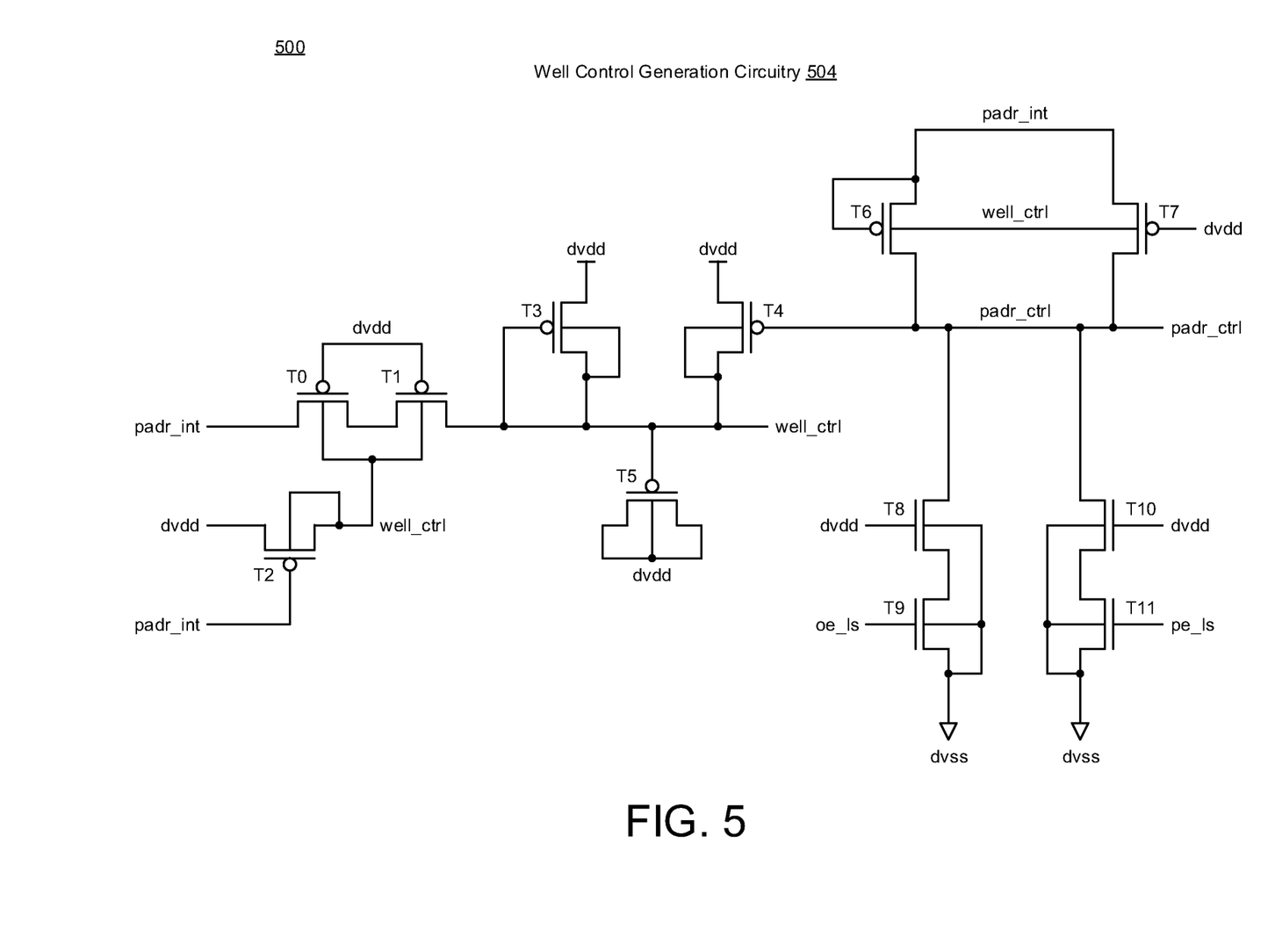
FIG. 5 illustrates a diagram of well control generation circuitry in accordance with various implementations described herein.

FIG. 5 illustrates a diagram 500 of well control generation circuitry 504 in accordance with various implementations described herein. In some instances, the well control generation circuitry 504 may be configured to generate and provide the well control signal (well_ctrl) in a manner as described herein.

In some implementations, the well control generation circuitry 504 may include transistors (T0, T1) that are coupled together in series between the padr_int signal and the well-control signal. Transistors (T0, T1) may have their gates coupled to dvdd and their substrate terminals coupled to the well_ctrl signal. Transistor (T2) may be coupled between dvdd and the substrate terminals of transistors T2 at the well_ctrl signal with its gate coupled to the padr_int signal and its substrate terminal coupled to the well_ctrl signal. Transistor (T3) may be coupled between dvdd and the well_ctrl signal with its gate and its substrate terminal coupled to the well_ctrl signal. Also, transistor (T5) may be coupled together as a capacitor between dvdd and the well_ctrl signal.

In some implementations, the well control generation circuitry 504 may include transistors (T6, T7) that are coupled together in parallel between the padr_int signal and the padr_ctrl signal. Transistor (T6) may have its gate coupled to the padr_int signal and its substrate terminal coupled to the well_ctrl signal, and transistor (T7) may have its gate coupled to dvdd and its substrate terminal coupled to the well_ctrl signal. Transistors (T8, T9) may be coupled in series between the padr_ctrl signal and ground (dvss), and transistors (T10, T11) may be coupled in series between the padr_ctrl signal and ground (dvss). Further, transistor (T8) may have its gate coupled to dvdd and its substrate terminal coupled to ground (dvss), and transistor (T9) may have its gate coupled to the oe_ls signal and its substrate terminal coupled to ground (dvss). Transistor (T10) may have its gate coupled to dvdd and its substrate terminal coupled to ground (dvss), and transistor (T11) may have its gate coupled to the pe_ls signal and its substrate terminal coupled to ground (dvss).

In some implementations, transistors (T8, T9, T10, T11) may be n-type MOS (NMOS) transistors, such as, e.g., n-type field effect transistors (NFETs). In other implementations, transistors (T0, T1, T2, T3, T4, T5, T6, T7) may be p-type MOS (PMOS) transistors, such as, e.g., p-type field effect transistors (PFETs).

Figure 6:
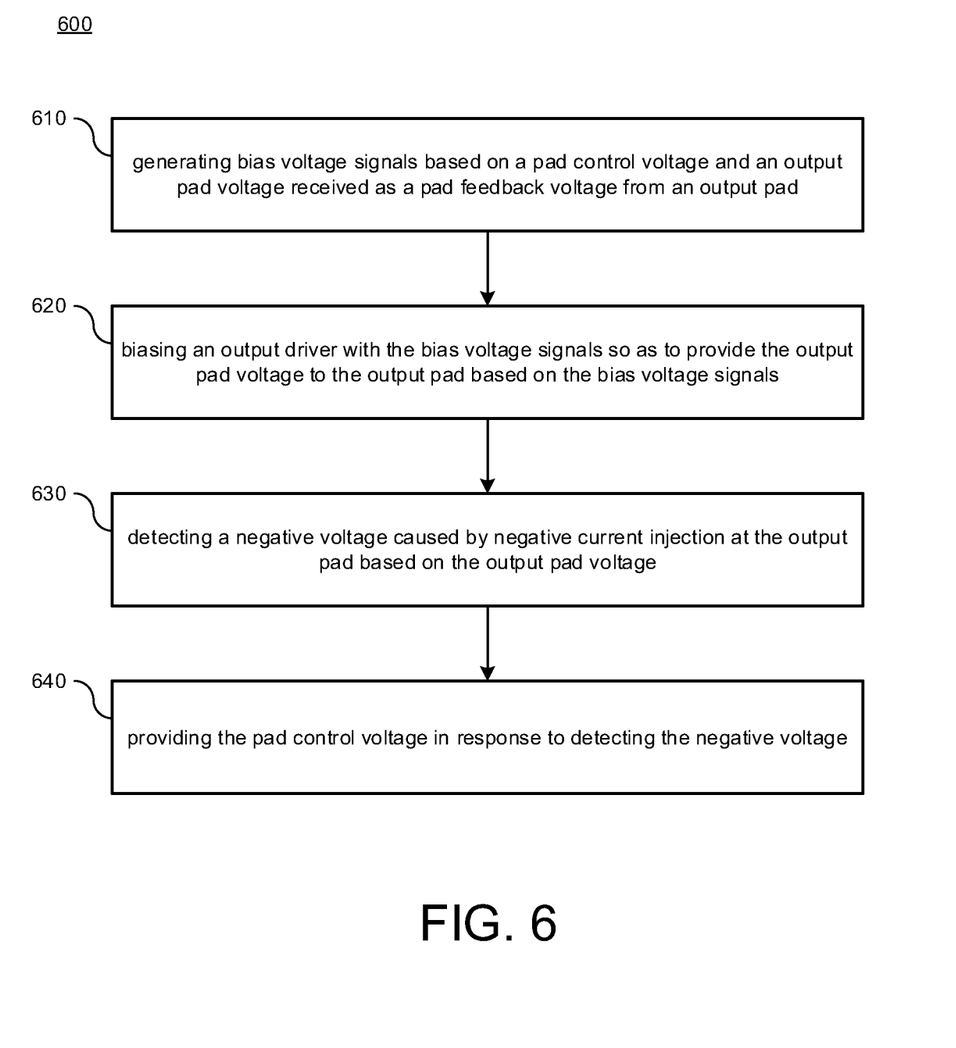
FIG. 6 illustrates a diagram of a method generating pad voltage in accordance with various implementations described herein.

FIG. 6 illustrates a process diagram of a method 600 generating pad voltage with pad control in accordance with various implementations described herein.

It should be understood that even though method 600 may indicate a particular order of operation execution, in some cases, various portions of the operations may be executed in a different order, and on different systems. In other cases, other operations and/or steps may be added to and/or omitted from method 600. Also, method 600 may be implemented in hardware and/or software. If implemented in hardware, method 600 may be implemented with components and/or circuitry, as described herein in reference to FIGS. 1-4. Also, if implemented in software, method 600 may be implemented as a program and/or software instruction process that is configured for providing the various schemes and techniques described herein. Also, if implemented in software, instructions related to implementing method 600 may be recorded in memory and/or a database. For instance, various types of computing devices having at least one processor and memory may be configured to perform method 600.

In various implementations, method 600 may refer to a method of designing, providing, building, fabricating and/or manufacturing overdrive 10 output architecture as an integrated system, device and/or circuitry that may involve use of the various circuit components described herein so as to implement the various schemes and techniques associated therewith. In some implementations, the overdrive 10 output architecture may be integrated with computing circuitry and various related components on a single chip, and also, the overdrive 10 output architecture may be implemented in various embedded chip-level systems for various electronic, mobile and Internet-of-things (IoT) applications, including remote sensor node applications.

At block 610, method 600 may generate bias voltage signals based on a pad control voltage and an output pad voltage received as a pad feedback voltage from an output pad. At block 620, method 600 may bias an output driver with the bias voltage signals so as to provide the output pad voltage to the output pad based on the bias voltage signals. At block 630, method 600 may detect a negative voltage caused by negative current injection at the output pad based on the output pad voltage. At block 640, method 600 may provide the pad control voltage in response to detecting the negative voltage.

In some implementations, the output driver may include a p-type driver stack having p-type transistors that are activated with the pbias voltage signal. The output driver may include an n-type driver stack having n-type transistors that are activated with the nbias voltage signal. Also, the output driver may provide the output pad voltage to the output pad from an output node disposed between the p-type driver stack and the n-type driver stack and based on the pbias voltage signal and the nbias voltage signals.

In some implementations, method 600 may derive an intermediate voltage from the pad control voltage and the pad feedback voltage provided by the output pad. Also, method 600 may receive the pad control voltage from a pad control generator, receive the intermediate voltage from an intermediate voltage generator, and receive the pad feedback voltage from the output pad. Also, method 600 may provide the bias voltage signals to the output driver based on the pad control voltage, the intermediate voltage and the pad feedback voltage. Further, method 600 may generate an nbias voltage signal of the bias voltage signals based on the pad control voltage and the intermediate voltage, generate a pbias voltage signal of the bias voltage signals based on the intermediate voltage and the pad feedback voltage, and provide the nbias voltage signal and the pbias voltage signal to the output driver.

In various implementations, in reference to FIGS. 1-6, the various schemes, techniques and designs may be configured to convert the pad voltage levels at the output pad from 4.63V/−1V to 4.63V/2.63V so as to ensure that whenever the supply voltage (dvdd) is at 3.63V (3.3V+10%) and the pad voltage is at −1V, then the tolerant driver circuitry does not have any over-voltage stress. In some instances, as described herein, the pad voltage converter circuitry may be used to derive the voltage for PMOS and NMOS driver stacks in the bias driver circuitry. In various scenarios, various working principles of the circuitry described herein may be explained in the following manner:

For instance, when DVDD=3.3V and PAD=4.63V, the stacked NMOS drivers are biased in such a way that the top NMOS is biased at 3.3V and the bottom NMOS gate may be 0V. In this condition, there may be no voltage stress on the N-Driver. For PMOS stack, the gate of bottom PMOS is following PAD voltage and the top PMOS gate is biased at 3.3V, so that there may be no stress on the P-Driver as well.

Also, for instance, when DVDD=3.3V and PAD=−1 V, during this condition, the traditional tolerant circuit may experience an over-voltage stress of [3.3−(−1)]=4.3V, and thus, various designs described herein may operate to lift an internal voltage (e.g., inside tolerant circuit) from −1V to 2.63V thereby reducing over-voltage stress. In some instances, stacked NMOS drivers may be biased in such a way that the top NMOS is biased at −1V and the bottom NMOS gate may be biased at 0V. This may ensure that the NMOS Driver is OFF when PAD=−1V. For the PMOS stack, the gate of the bottom PMOS may be biased at any voltage between 0V and 2.63V and the top PMOS can be at 3.3V. As such, there may be no stress on N-Driver and P-Driver, and the pad voltage converter circuitry may be used to bias the receiver circuitry so as to avoid reliability issues that may occur during operation.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device with a bias generator that receives a pad control signal, receives an output pad voltage as a pad feedback signal from an output pad, and provides bias voltage signals based on the pad control signal and the pad feedback signal. The device may have a bias driver that receives the bias signals from the bias generator and provides the output pad voltage to the output pad based on the bias signals. The device may have a pad voltage detector that receives the output pad voltage as the pad feedback signal from the output pad and provides the pad control signal to the bias generator based on the pad feedback signal.

Described herein are various implementations of a device with a bias generator that provides bias voltage signals based on a pad control voltage and an output pad voltage received as a pad feedback voltage from an output pad. The device may have a bias driver that provides the output pad voltage to the output pad based on the bias voltage signals. The device may have a pad control detector that detects a negative voltage caused by negative current injection at the output pad based on the output pad voltage and provides the pad control voltage to the bias generator in response to detecting the negative voltage.

Described herein are various implementations of a method. The method may generate bias voltage signals based on a pad control voltage and an output pad voltage received as a pad feedback voltage from an output pad. The method may bias an output driver with the bias voltage signals so as to provide the output pad voltage to the output pad based on the bias voltage signals. The method may detect a negative voltage caused by negative current injection at the output pad based on the output pad voltage. The method may provide the pad control voltage in response to detecting the negative voltage.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A device comprising:
a pad voltage detector that receives an output pad voltage as a pad feedback signal from an output pad, provides a pad control signal based on the pad feedback signal and provides an intermediate signal based on the pad control signal, wherein the output pad voltage corresponds to the pad feedback signal;
a bias generator that receives the pad control signal from the pad voltage detector, receives the output pad voltage as the pad feedback signal from the output pad, and provides bias voltage signals based on the pad control signal and the pad feedback signal; and
a bias driver that receives the bias voltage signals from the bias generator and provides the output pad voltage to the output pad based on the bias voltage signals,
wherein the pad voltage detector comprises:
pad control generation circuitry connected between a supply voltage and a first node outputting the pad control signal; and
intermediate generation circuitry connected between the first node outputting the pad control signal and a second node outputting the intermediate signal.

2. The device of claim 1, wherein:
the pad voltage detector generates the pad control signal based on the pad feedback signal, generates the intermediate signal based on the pad feedback signal and the pad control signal, and provides the pad control signal and the intermediate signal to the bias generator, wherein a level of the pad feedback signal follows or is the same as the output pad voltage, and
the bias generator receives the pad control signal from the pad voltage detector, receives the intermediate signal from the pad voltage detector, receives the output pad voltage as the pad feedback voltage from the output pad, and provides the bias voltage signals to the bias driver based on the pad control signal, the intermediate signal and the pad feedback signal.

3. The device of claim 2, further comprising:
a well control generator that receives the pad control signal from the pad voltage detector, receives the intermediate signal from the pad voltage detector, and generates a well control signal based on the pad control signal and the intermediate signal.

4. The device of claim 1, wherein:
the pad voltage detector comprises pad control generation circuitry that detects a negative voltage caused by a negative current injection at the output pad based on the output pad voltage and then generates the pad control signal in response to detecting the negative voltage,
the intermediate generation circuitry derives the intermediate signal from the pad control signal and the output pad voltage, and
the bias voltage signals are dynamically set across a range of values.

5. The device of claim 4, wherein:
the pad control generation circuitry receives the output pad voltage as the pad feedback signal from the output pad, generates the pad control signal based on the pad feedback signal, and then provides the pad control signal to the bias generator.

6. The device of claim 5, wherein:
the bias generator has nbias generation circuitry that receives the pad control signal from the pad control generation circuitry, receives the intermediate signal from the intermediate generation circuitry, generates an nbias voltage signal of the bias voltage signals based on the pad control signal and the intermediate signal, and provides the nbias voltage signal to the bias driver.

7. The device of claim 4, wherein:
the intermediate generation circuitry receives the output pad voltage as the pad feedback signal from the output pad, receives the pad control signal from the pad control generation circuitry, generates the intermediate signal based on the pad feedback signal and the pad control signal, and provides the intermediate signal to the bias generator.

8. The device of claim 7, wherein:
the bias generator has pbias generation circuitry that receives the intermediate signal from the intermediate generation circuitry, receives the output pad voltage as the pad feedback signal from the output pad, generates a pbias voltage signal of the bias voltage signals based on the intermediate signal and the pad feedback signal, and then provides the pbias voltage signal to the bias driver, and
wherein the pad voltage detector sets the intermediate signal to:
a first value during a first operation;
a second value, different from the first value, during a negative injection condition; and
a third value, different from the first and second value, during an over-voltage condition.

9. The device of claim 1, wherein:
the pad voltage detector is configured to generate the pad control signal based on the pad feedback signal, generate the intermediate signal based on the pad feedback signal and the pad control signal, and provide the pad control signal and the intermediate signal to the bias generator,
the bias generator is configured to generate the bias voltage signals based on the pad control signal, the intermediate signal and the pad feedback signal,
the bias voltage signals include a pbias voltage signal for biasing a p-type transistor stack and an nbias voltage signal for biasing an n-type transistor stack, and
the bias voltage signals are set to:
first values during a first operation;
second values different from the first values during a negative injection condition; and
third values different from the first and second values during an over-voltage condition.

10. The device of claim 9, wherein:
the bias driver includes a p-type driver stack having the p-type transistor stack that is activated with the pbias voltage signal from the bias generator,
the bias driver includes an n-type driver stack having the n-type transistor stack that is activated with the nbias voltage signal from the bias generator, and
the bias driver provides the output pad voltage to the output pad from an output node coupled between the p-type driver stack and the n-type driver stack and based on the pbias voltage signal and the nbias voltage signal.

11. A device comprising:
a pad control detector that receives an output pad voltage as a pad feedback voltage from an output pad, provides a pad control voltage based on whether the pad feedback voltage is a negative voltage caused by negative current injection at the output pad, and further provides:
an intermediate voltage greater than the pad feedback voltage when the pad control voltage indicates the pad feedback voltage is the negative voltage; or the intermediate voltage that substantially matches the pad feedback voltage when the pad control voltage indicates the pad feedback voltage is not the negative voltage;

a bias generator that receives the pad control voltage and the intermediate voltage from the pad control detector, receives the output pad voltage as the pad feedback voltage from the output pad, and provides bias voltage signals based on the pad control voltage, the intermediate voltage and the output pad voltage received as the pad feedback voltage from the output pad; and a bias driver that receives the bias voltage signals from the bias generator and provides the output pad voltage to the output pad based on the bias voltage signals.

12. The device of claim 11, further comprising:

an intermediate voltage generator that derives the intermediate voltage from the pad control voltage and the pad feedback voltage provided by the output pad, wherein the intermediate voltage is set to substantially match the pad feedback voltage when the pad control voltage corresponds to a voltage within a predefined positive voltage range, and wherein the bias generator receives the pad control voltage, receives the intermediate voltage, receives the output pad voltage as the pad feedback voltage from the output pad, and provides the bias voltage signals based on the pad control voltage, the intermediate voltage and the pad feedback voltage.

13. The device of claim 12, further comprising:

a well control generator that receives the pad control voltage, receives the intermediate voltage, and generates a well control voltage based on the pad control voltage and the intermediate voltage.

14. The device of claim 12, wherein:

the bias generator has an nbias generator that generates an nbias voltage signal of the bias voltage signals based on the pad control voltage and the intermediate voltage, and then provides the nbias voltage signal to the bias driver, and the bias generator has a pbias generator that generates a pbias voltage signal of the bias voltage signals based on the intermediate voltage and the pad feedback voltage, and then provides the pbias voltage signal to the bias driver.

15. The device of claim 14, wherein:

the bias driver includes a p-type driver stack having a p-type transistor stack that is activated with the pbias voltage signal from the pbias generator, the bias driver includes an n-type driver stack having an n-type transistor stack that is activated with the nbias voltage signal from the nbias generator, and the bias driver provides the output pad voltage to the output pad from an output node coupled between the p-type driver stack and the n-type driver stack and based on the pbias voltage signal and the nbias voltage signal.

16. A method comprising:

receiving, at a pad voltage detector, an output pad voltage as a pad feedback voltage from an output pad;

providing, using the pad voltage detector, a pad control voltage based on whether the pad feedback voltage is negative voltage caused by negative current injection at the output pad;

providing, using the pad voltage detector:

an intermediate voltage greater than the pad feedback voltage when the pad control voltage indicates the pad feedback voltage is the negative voltage; or the intermediate voltage that substantially matches the pad feedback voltage when the pad control voltage indicates the pad feedback voltage is not the negative voltage;

receiving, at a bias generator, the pad control voltage and the intermediate voltage from the pad voltage detector;

receiving, at the bias generator, the output pad voltage as the pad feedback voltage from the output pad;

generating, using the bias generator, bias voltage signals based on the pad control voltage, the intermediate voltage and the output pad voltage received as the pad feedback voltage from the output pad;

biasing, using the bias generator, an output driver with the bias voltage signals so as to provide the output pad voltage to the output pad based on the bias voltage signals.

17. The method of claim 16, further comprising:

deriving, using the pad voltage detector, the intermediate voltage from the pad control voltage and the pad feedback voltage provided by the output pad, setting a first bias voltage signal among the bias voltage signals to the intermediate voltage;

setting a second bias voltage signal among the bias voltage signals to the intermediate voltage minus a threshold when the pad control voltage indicates that the pad feedback voltage is the negative voltage; or setting the second bias voltage signal to substantially match the pad feedback voltage when the pad control voltage indicates that the pad feedback voltage is not the negative voltage.

18. The method of claim 17, wherein:

receiving, at the bias generator, the pad control voltage comprises:

receiving the pad control voltage from a pad control generator of the pad voltage detector, and receiving the intermediate voltage from an intermediate voltage generator of the pad voltage detector; and biasing, using the bias generator, the output driver with the bias voltage signals comprises providing the bias voltage signals to the output driver based on the pad control voltage, the intermediate voltage and the pad feedback voltage.

19. The method of claim 18, wherein:

generating, using the bias generator, the bias voltage signals comprises:

generating an nbias voltage signal of the bias voltage signals based on the pad control voltage and the intermediate voltage, and generating a pbias voltage signal of the bias voltage signals based on the intermediate voltage and the pad feedback voltage; and biasing, using the bias generator, the output driver with the bias voltage signals comprises providing the nbias voltage signal and the pbias voltage signal to the output driver.

20. The method of claim 19, wherein:

the output driver includes a p-type driver stack having a p-type transistor stack that is activated with the pbias voltage signal, the output driver includes an n-type driver stack having an n-type transistor stack that is activated with the nbias voltage signal, and the output driver provides the output pad voltage to the output pad from an output node coupled between the p-type driver stack and the n-type driver stack and based on the pbias voltage signal and the nbias voltage signal.

\* \* \* \* \*